(12) United States Patent
Rappoport et al.

(10) Patent No.: US 8,716,932 B2
(45) Date of Patent: May 6, 2014

(54) DISPLAYS WITH MINIMIZED BORDERS

(75) Inventors: Benjamin M. Rappoport, San Francisco, CA (US); Jeremy C. Franklin, San Francisco, CA (US); Cheng Chen, San Jose, CA (US); Scott A. Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 361 days.

(21) Appl. No.: 13/036,944

(22) Filed: Feb. 28, 2011

(65) Prior Publication Data

US 2012/0218219 A1  Aug. 30, 2012

(51) Int. Cl.
*G06F 3/044* (2006.01)
*H05K 1/00* (2006.01)
*H01L 51/52* (2006.01)

(52) U.S. Cl.
USPC ............................ 313/512; 313/504; 313/506

(58) Field of Classification Search
USPC .................... 313/495–512; 345/690, 76, 173
See application file for complete search history.

(56) References Cited

U.S. PATENT DOCUMENTS

| | | | |
|---|---|---|---|
| 4,066,855 A | 1/1978 | Zenk | |
| 4,085,302 A | 4/1978 | Zenk et al. | |
| 5,235,451 A | 8/1993 | Bryan | |
| 5,436,745 A * | 7/1995 | Voisin et al. | 349/58 |
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,504,530 B1 * | 1/2003 | Wilson et al. | 345/173 |
| 6,690,387 B2 | 2/2004 | Zimmerman et al. | |
| 6,803,245 B2 | 10/2004 | Auch et al. | |

(Continued)

FOREIGN PATENT DOCUMENTS

| | | |
|---|---|---|
| EP | 2187443 | 5/2010 |
| JP | 9321083 | 12/1997 |

(Continued)

OTHER PUBLICATIONS

Chen et al., U.S. Appl. No. 13/186,238, filed Jul. 19, 2011.

(Continued)

*Primary Examiner* — Anh Mai
*Assistant Examiner* — Elmito Breval
(74) *Attorney, Agent, or Firm* — Treyz Law Group; G. Victor Treyz; Kendall P. Woodruff (57) ABSTRACT

An electronic device may be provided with a display having a flexible substrate with bent edges. The flexible substrate may have a planar active region that includes an array of light-emitting elements such as organic light-emitting diodes with associated control lines. The flexible substrate may also have inactive regions that lie outside of the active region. The bent edges may be formed from portions of the flexible substrate in the inactive regions. Traces for distributing control signals to the control lines in the active region may be formed in the inactive regions. Corner openings may be formed at the corners of the flexible substrate to accommodate bending of the flexible substrate in the inactive regions. A jumper or a portion of the flexible substrate that lies outside of a corner opening may be used to convey signals between traces on adjoining inactive regions.

17 Claims, 12 Drawing Sheets

(56) References Cited

U.S. PATENT DOCUMENTS

| | | |
|---|---|---|
| 6,956,633 B2 | 10/2005 | Okada et al. |
| 7,015,894 B2 | 3/2006 | Morohoshi |
| 7,034,913 B2 | 4/2006 | Ishida |
| 7,184,064 B2 | 2/2007 | Zimmerman et al. |
| 7,453,542 B2 | 11/2008 | Muramatsu et al. |
| 7,541,671 B2 | 6/2009 | Foust et al. |
| 7,593,086 B2 | 9/2009 | Jeong et al. |
| 7,593,087 B2 | 9/2009 | Jang |
| 7,663,607 B2 | 2/2010 | Hotelling et al. |
| 7,767,048 B2 | 8/2010 | Kanbayashi |
| 7,787,917 B2 | 8/2010 | Aoki et al. |
| 7,834,451 B2 | 11/2010 | Lee et al. |
| 7,936,405 B2 | 5/2011 | Kitagawa |
| 8,134,675 B2 | 3/2012 | Kawaguchi et al. |
| 8,194,048 B2 | 6/2012 | Oowaki |
| 2005/0285990 A1 | 12/2005 | Havelka et al. |
| 2006/0026521 A1 | 2/2006 | Hotelling et al. |
| 2006/0197753 A1 | 9/2006 | Hotelling |
| 2007/0148831 A1 | 6/2007 | Nagata et al. |
| 2008/0117376 A1 | 5/2008 | Takenaka |
| 2009/0027896 A1 | 1/2009 | Nishimura et al. |
| 2009/0167171 A1 | 7/2009 | Jung et al. |
| 2009/0201635 A1 | 8/2009 | Kim et al. |
| 2009/0256471 A1 | 10/2009 | Kim et al. |
| 2009/0284688 A1 | 11/2009 | Shiraishi et al. |
| 2009/0315837 A1* | 12/2009 | Geiger .................. 345/173 |
| 2010/0007817 A1 | 1/2010 | Kim |
| 2010/0026952 A1 | 2/2010 | Miura et al. |
| 2010/0208190 A1 | 8/2010 | Yoshida |
| 2010/0225624 A1 | 9/2010 | Fu et al. |
| 2010/0315399 A1 | 12/2010 | Jacobson et al. |
| 2011/0007042 A1* | 1/2011 | Miyaguchi .................. 345/204 |
| 2011/0086680 A1 | 4/2011 | Kim et al. |
| 2011/0227846 A1 | 9/2011 | Imazeki |
| 2012/0062447 A1 | 3/2012 | Tseng et al. |
| 2012/0127087 A1 | 5/2012 | Ma |

FOREIGN PATENT DOCUMENTS

| | | |
|---|---|---|
| JP | 2000163031 | 6/2000 |
| JP | 2002342033 | 11/2002 |
| JP | 2010060866 | 3/2010 |
| JP | 2010060866 A | 3/2010 |
| WO | 9604682 | 2/1996 |
| WO | 0169577 | 9/2001 |

OTHER PUBLICATIONS

Drzaic et al., U.S. Appl. No. 13/252,971, filed Oct. 4, 2011.
Franklin et al., U.S. Appl. No. 13/250,227, filed Sep. 30, 2011.
Franklin et al., U.S. Appl. No. 13/250,666, filed Sep. 30, 2011.
Franklin et al., U.S. Appl. No. 13/310,409, filed Dec. 2, 2011.
Franklin et al., U.S. Appl. No. 13/422,724, filed Mar. 16, 2011.
Lynch, U.S. Appl. No. 13/184,303, filed Jul. 15, 2011.
Martisauskas et al., U.S. Appl. No. 13/229,120, filed Sep. 9, 2011.
Myers et al., U.S. Appl. No. 13/108,256, filed May 16, 2011.
Myers et al., U.S. Appl. No. 13/246,510, filed Sep. 27, 2011.
Park et al., U.S. Appl. No. 13/591,095, filed Feb. 28, 2011.
Chen et al., U.S. Appl. No. 13/585,666, filed Aug. 14, 2012.
Raff et al., U.S. Appl. No. 13/452,061, filed Apr. 20, 2012.
Rappoport et al., U.S. Appl. No. 13/249,734, filed Sep. 30, 2011.
Rappoport et al., U.S. Appl. No. 13/273,851, filed Oct. 14, 2011.
Rothkopf et al., U.S. Appl. No. 13/171,295, filed Jun. 28, 2011.
Rothkopf et al., U.S. Appl. No. 13/177,165, filed Jul. 6, 2011.
Lee, S.K. et al., (Apr. 1985). "A multi-touch three dimensional touch-sensitive tablet," Proceedings of CHI: ACM Conference on Human Factors in Computing Systems, pp. 21-25.
Rubine, D.H., (Dec. 1991). "The automatic recognition of gestures," CMU-CS-91-202, Submitted in partial fulfillment of the requirements for the degree of doctor of philosophy in computer science at Carnegie Mellon University, 285 pages.
Rubine, D.H. (May 1992). "Combining gestures and direct manipulation," CHI 92, pp. 659-660.
Westermand, W. (Spring 1999). "Hand tracking, finger identification, and chordic manipulation on a multi-touch surface," A dissertation submitted to the faculty of the University of Delaware in partial fulfillment of the requirements for the Degree of Doctor of Philosophy in Electrical Engineering, 364 pages.
Martisauskas et al., U.S. Appl. No. 13/229,120, filed Sep 9. 2011.

* cited by examiner

DISPLAYS WITH MINIMIZED BORDERS

BACKGROUND

This relates generally to electronic devices, and more particularly, to displays for electronic devices.

Electronic devices often include displays. Displays such as organic light-emitting diode (OLED) displays contain pixels that produce illumination without using a separate backlight unit. In a typical organic light-emitting display, an array of active image pixels is controlled using a pattern of orthogonal control lines.

The active image pixels form a rectangular active area in the center of the display. The active region in the center of the display is surrounded by an inactive border region. The inactive border region includes space for fanning out the control lines from a centralized location at which a signal cable for the driver circuitry is attached. Ensuring that there is sufficient area to reliably attach the signal cable and to fan out the control lines along the edges of the active area may require a significant amount of inactive border area. It is not uncommon for the width of the inactive border to be up to a centimeter wide or more. This type of wide inactive region tends to make displays bulky and requires the use of electronic device housings with wide bezels.

It would therefore be desirable to be able to minimize the width of the inactive region in a display to satisfy consumer demand for small and aesthetically pleasing electronic devices and displays.

SUMMARY

An electronic device may be provided that has a display formed from a flexible light-emitting diode layer with bent edges. The flexible light-emitting diode layer may include a carrier formed from a flexible sheet of polymer or other flexible substrate. An array of light-emitting diodes such as organic light-emitting diodes may form a planar active region on the flexible substrate.

Signal traces and other circuits that do not emit light may be located in inactive edge portions of the flexible substrate.

The flexible substrate may have openings at its corners to accommodate bending of its edges. The openings may be notches or may be holes that are surrounded by portions of the flexible substrate to accommodate control line traces.

The inactive edge portions of the flexible substrate may be bent away from the plane of the active region about a bend axis. Portions of the traces in the inactive region may be enlarged where they overlap the bend axis to ensure that the integrity of the traces is maintained during bending. Adhesive may be used to form a bend axis strain relief structure that runs around the periphery of the display.

A display configuration with vias may be used to interconnect frontside and backside control lines without bending the inactive edges of the flexible substrate.

Further features of the invention, its nature and various advantages will be more apparent from the accompanying drawings and the following detailed description of the preferred embodiments.

DETAILED DESCRIPTION

Electronic devices may include displays. Displays may be used to display visual information such as text and images to users.

Figure 1:
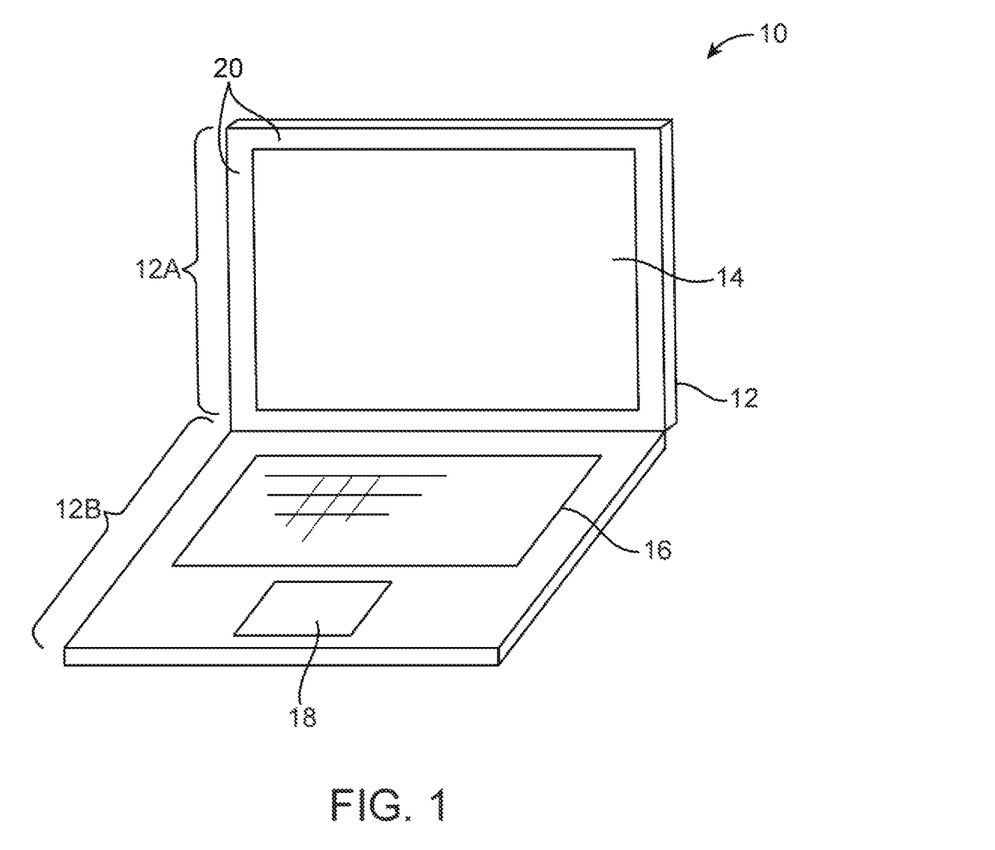
FIG. 1 is a perspective view of an illustrative electronic device such as a laptop computer with a display in accordance with an embodiment of the present invention.
Figure 2:
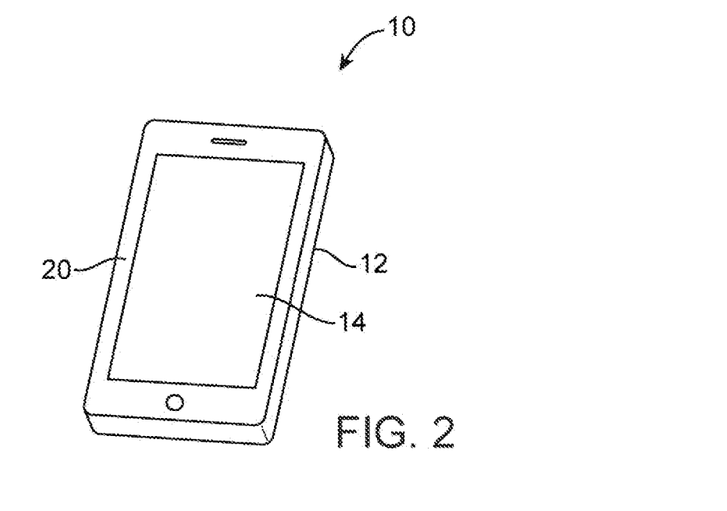
FIG. 2 is a perspective view of an illustrative electronic device such as a handheld electronic device with a display in accordance with an embodiment of the present invention.
Figure 3:
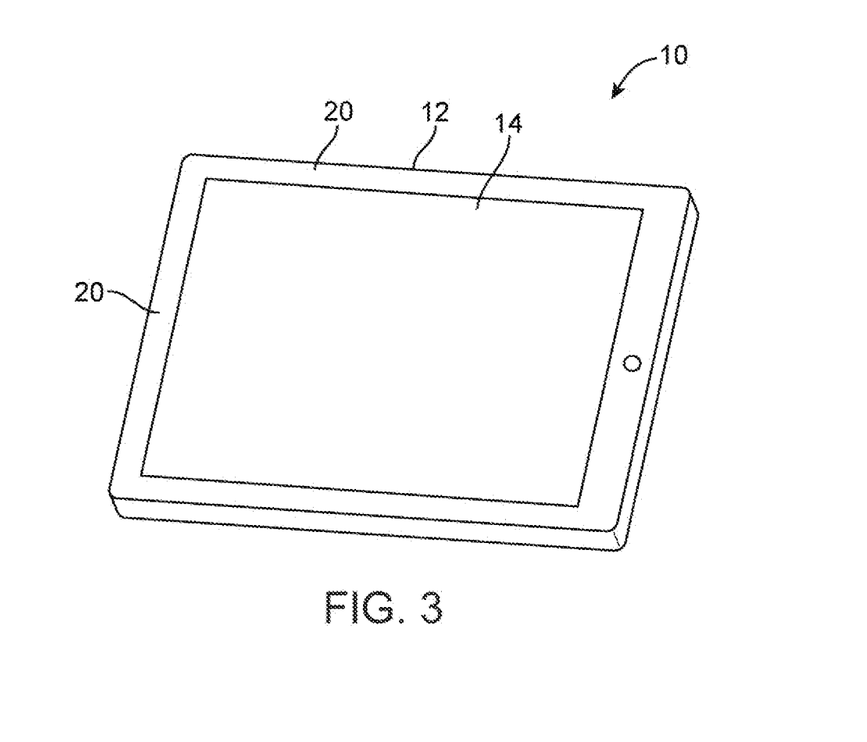
FIG. 3 is a perspective view of an illustrative electronic device such as a tablet computer with a display in accordance with an embodiment of the present invention.

Illustrative electronic devices that may be provided with displays are shown in FIGS. 1, 2, and 3. FIG. 1 shows how electronic device 10 may have the shape of a laptop computer having upper housing 12A and lower housing 12B with components such as keyboard 16 and touchpad 18. FIG. 2 shows how electronic device 10 may be a handheld device such as a cellular telephone, music player, gaming device, navigation unit, or other compact device. FIG. 3 shows how electronic device 10 may be a tablet computer. These are merely illustrative examples. Electronic devices such as illustrative electronic device 10 of FIGS. 1, 2, and 3 may be laptop computers, computer monitors with embedded computers, tablet computers, cellular telephones, media players, other handheld and portable electronic devices, smaller devices such as wristwatch devices, pendant devices, headphone and earpiece devices, other wearable and miniature devices, or other electronic equipment.

Device 10 may have a housing such as housing 12. Housing 12, which is sometimes referred to as a case, may be formed of materials such as plastic, glass, ceramics, carbon-fiber composites and other composites, metal, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may have one or more displays such as display 14. Display 14 may be an organic light-emitting diode (OLED) display or other suitable display. Display 14 may, if desired, include capacitive touch sensor electrodes for a capacitive touch sensor array or other touch sensor structures (i.e., display 14 may be a touch screen). Touch sensor electrodes may be provided on a touch panel layer that is interposed between an organic light-emitting diode display layer and a transparent cover layer (e.g., a cover glass layer), may be formed on the underside of a cover layer, or may otherwise be incorporated into display 14.

The organic light-emitting diode layer (sometimes referred to as the diode layer, the display layer, the display, or the image pixel layer) may have a planar rectangular active region in its center. The rectangular active region includes an array of light-emitting diode pixels. The edges of the organic light-emitting diode layer surround the active center region and form a rectangular peripheral ring. This border region contains circuitry that does not emit light and is therefore referred to as the inactive portion of the display. The inactive portion of the display is shown as inactive border region 20 in FIGS. 1, 2, and 3.

To enhance device aesthetics, the width of inactive border region 20 that is visible from the front of the display may be minimized by bending portions of the organic light-emitting diode layer downwards along the boundary between the active region and the inactive region. For example, the edges of the organic light-emitting diode array may be folded so that they lie perpendicular to the plane of the active region. When this type of arrangement is used, the width of inactive border regions 20 of devices 10 of FIGS. 1, 2, and 3 that is visible from the front of display 14 is minimized. The minimal edge portion of display 14 that remains visible may be covered with a bezel or a portion of a display cover layer that is coated on its underside with an opaque masking layer such as black ink (as examples). A bezel may be formed, for example, from a stand-alone bezel structure that is mounted to housing 12, from a portion of housing 12 (e.g., a portion of the sidewalls of housing 12), or using other suitable structures.

Figure 4:
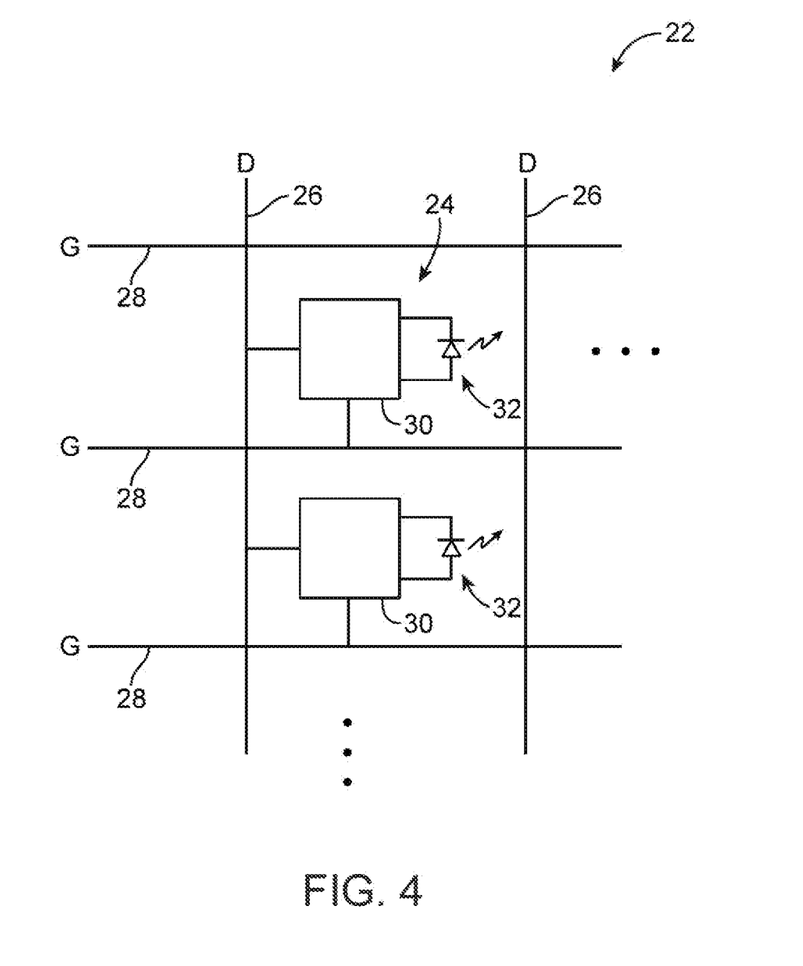
FIG. 4 is a circuit diagram of a portion of a pixel array on a display in accordance with an embodiment of the present invention.

A portion of the active region in display 14 is shown in FIG. 4. As shown in FIG. 4, the active region may include an array of light-emitting display pixels 24 such as array 22. Pixels 24 may be arranged in rows and columns in array 24 and may be controlled using a pattern of orthogonal control lines. The control lines in pixel array 22 may include gate lines 28 and data lines 26. There may be, for example, a pair of gate lines 28 interposed between each row of pixels 24 and a data line interposed between each column of image pixels. Each pixel may include a light-emitting element such as organic light-emitting diode 32 and associated control circuitry 30. Control circuitry 30 may be coupled to the data lines and gate lines so that control signals may be received from driver circuitry. The driver circuitry may include on-display driver circuits such as gate line drivers implemented using low-temperature polysilicon transistors formed in the inactive portion of the display. The driver circuitry may also include a driver integrated circuit (e.g., a driver integrated circuit mounted in the inactive region or a driver integrated circuit mounted on an external printed circuit and coupled to pads in the inactive region using a cable such as a cable based on a flex circuit).

Figure 5:
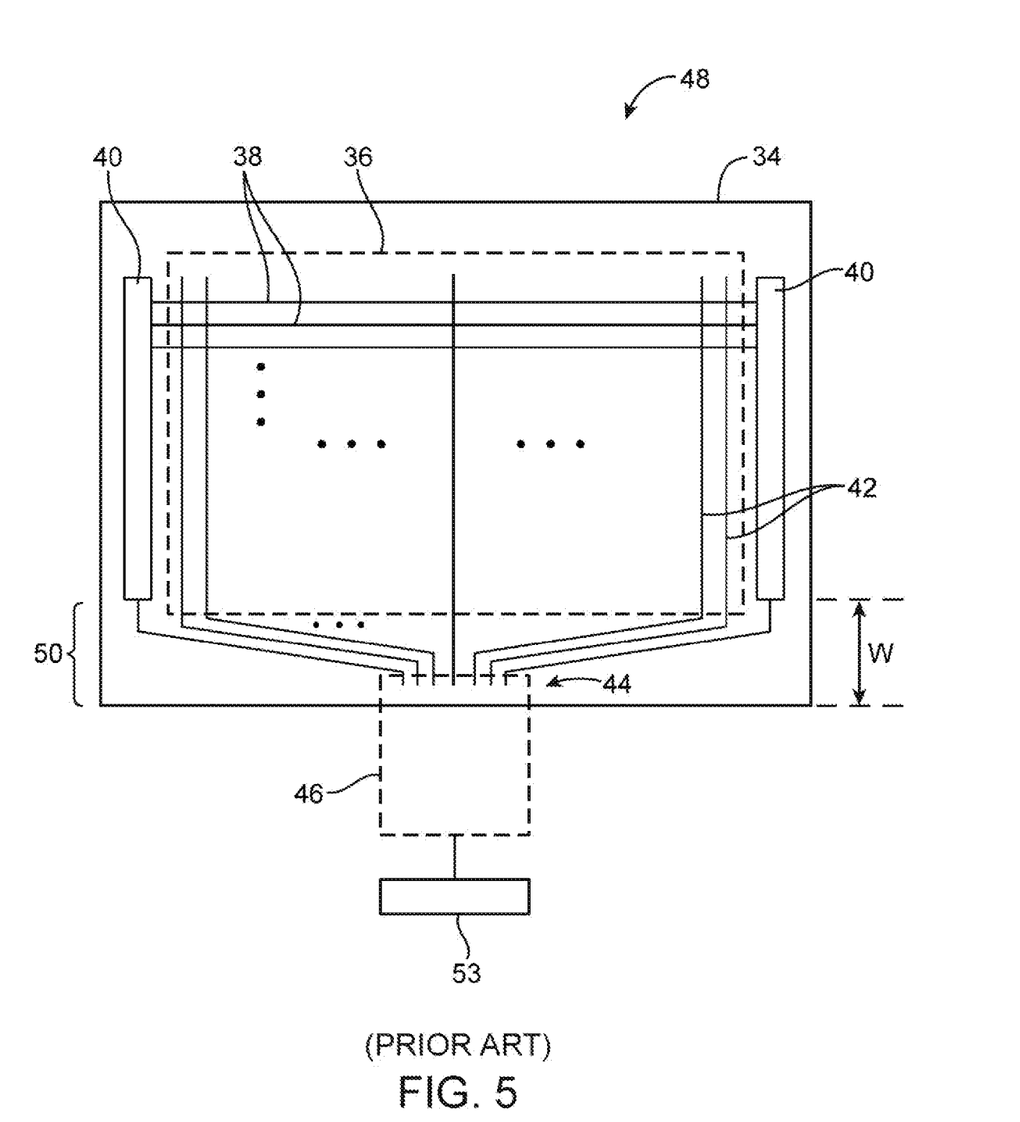
FIG. 5 is a diagram of a conventional organic light-emitting diode display.

A top view of a conventional organic light-emitting diode integrated circuit is shown in FIG. 5. As shown in FIG. 5, display 48 may include a substrate such as substrate 34 that includes an array of organic light-emitting diodes and control circuits within rectangular active region 36. The portion of substrate 34 that lies outside of active region 36 forms an inactive border region. Gate lines 38 and data lines 42 may be used to distribute control signals to the display pixels. Gate line driver circuits 40 may be formed on display 48 in the inactive region. Driver integrated circuit 53 may supply control signals to display 48 using flex circuit cable 46. Flex circuit cable 46 is attached to substrate 34 using conductive pads in region 44. In lower edge region 50, the control lines are organized in a pattern that fans out from region 44.

To accommodate the conductive pads for attaching flex circuit cable 46 and to accommodate the fan out pattern for the control lines along edge 50, the width W of edge 50 (i.e., the lower portion of the inactive region in FIG. 5) may need to be about 5-15 mm. The left, right, and upper inactive region may also need to be at least several millimeters to a centimeter wide. To hide the inactive border region from view by a user, the inactive boarder region of conventional displays is typically covered by a trim piece such as a plastic bezel or a border of opaque ink printed on the underside of a display cover glass layer. Large border widths tend to make the devices that include conventional displays more bulky than desired and may not be aesthetically appealing.

To minimize the width of the bezel, opaque ink border, or other such inactive border structures in display 14 of device 10, display 14 may be formed from an organic light-emitting diode layer that has bent inactive region edges. By bending the inactive edge portions of the display out of the plane of the active region, the amount by which the inactive edge portions extend laterally past the boundary of the active region may be minimized (e.g., to 3 mm or less, 2 mm or less, 1 mm or less, etc.).

Figure 6:
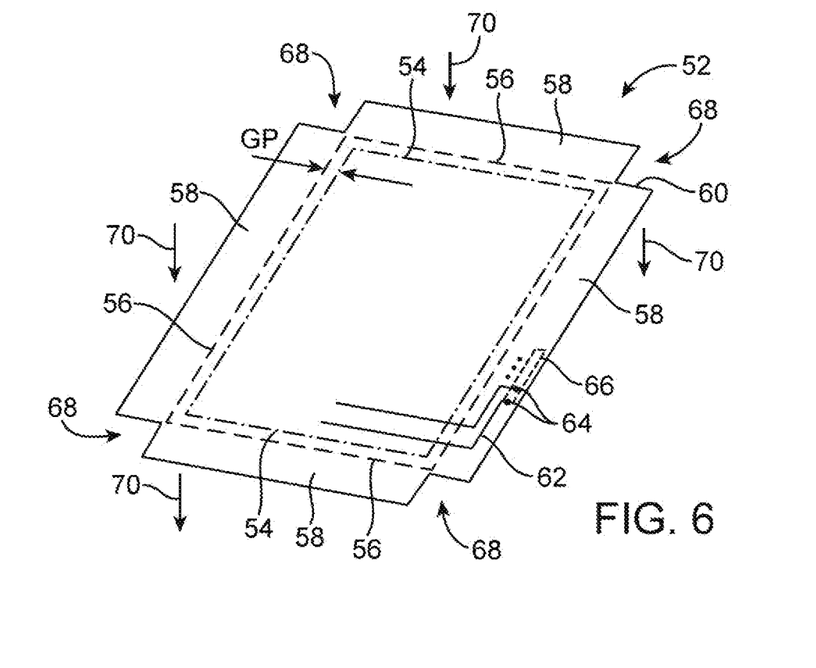
FIG. 6 is a perspective view of an illustrative display formed from a rectangular substrate with openings such as corner notches to accommodate bending in accordance with an embodiment of the present invention.

A perspective view of an organic light-emitting diode layer for display 14 before bending the inactive regions is shown in FIG. 6. As shown in FIG. 6, light-emitting layer 52 may be formed from substrate 60. Substrate 60, which may sometimes be referred to as a carrier, may be formed from one or more layers of flexible material such as sheets of polymer (e.g., polyethylene terephthalate, polyimide, or other materials that are capable of being provided in thin flexible sheets). A flexible polarizer layer may be formed on the top of substrate 60 if desired. An array of organic light-emitting diode pixels 24 such as array 44 of FIG. 4 may be formed on the surface of substrate 60.

The boundary of the active area of substrate 60 is shown by line 54 in the FIG. 6 example. The portion of substrate 60 that lies within the rectangle bounded by line 54 forms the active area of display 14. The portion of substrate 60 outside of the rectangle bounded by line 54 forms the inactive area of display 14.

Conductive traces for control lines such as control lines 62 may be formed on the surface of substrate 60. Portions of control lines 62 form the gate lines and data lines of the pixel array in active area 54. Other portions of control lines 62 lie in the inactive area of substrate 60 (outside of active area 54). For example, parts of control lines 62 are used in connecting contacts 64 to the gate lines and data lines in array 22. Contacts 64 may be arranged in an array pattern in region 66. A flex circuit cable may be attached to the contacts in region 66 (e.g., using anisotropic conductive film, other conductive adhesive, solder, etc.). The flex circuit may be connected to a driver integrated circuit that supplies signals to array 22 during operation (e.g., a driver integrated circuit such as driver integrated circuit 53 of FIG. 5). If desired, a driver integrated circuit may be mounted to substrate 60 in region 66. Driver circuits (e.g., gate line drivers formed from low-temperature polysilicon transistors on substrate 60 or other suitable driver circuits) may also be formed on substrate 60 in the inactive region.

Substrate 60 may have a rectangular shape with openings at its corners. The openings may be notches, slits, holes, etc. In the illustrative example of FIG. 6, rectangular cutouts 68 (notches) have be formed at each of the four corners of substrate 60. The removal of portions of substrate 60 at each of the corners of substrate 60 allows the four edges of substrate 60 in organic light-emitting diode layer 52 to be bent out of the plane of active area 54. For example, each of edges 58 of substrate 60 may be folded or otherwise bent downwards in direction 70 along bend lines (fold lines) 56 without creating folds of excess material at the corners.

The lateral separation GP between the perimeter of active area 54 and the location of bend line (axis) 56 may be significantly smaller than the conventional width of the inactive area in conventional displays of the type shown in FIG. 5. For example, distance GP may be about 0.2 to 2 mm (as an example).

Figure 7:
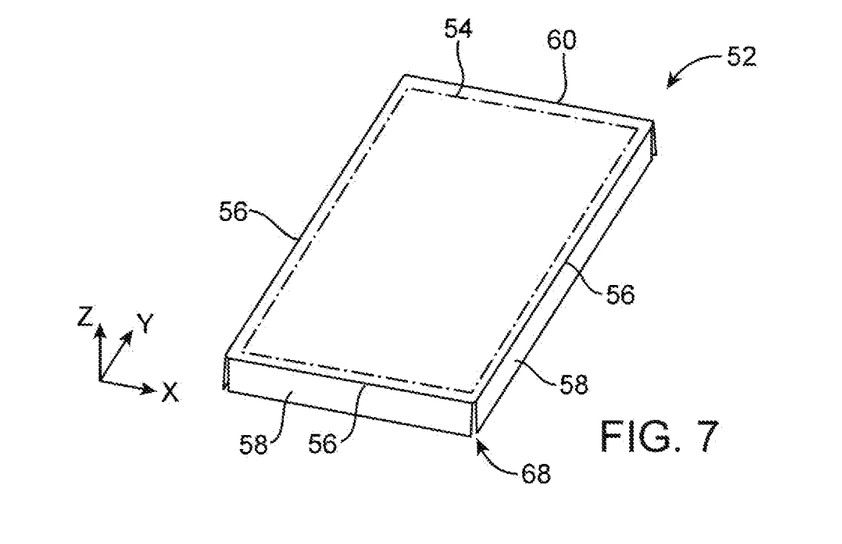
FIG. 7 is a perspective view of the illustrative display of FIG. 6 after its edges have been bent in accordance with an embodiment of the present invention.

Following bending of the inactive areas (i.e., edges 58) of substrate 60, organic light-emitting diode layer 52 may have a shape of the type shown in FIG. 7. As shown in FIG. 7, edges 58 may, for example, be bent downwards to lie in planes that are perpendicular to the plane of active area 54. If desired, other shapes may be formed for layer 52 (e.g., by bending edges 58 of substrate 69 more or less than shown in FIG. 7). An advantage of bending edges 58 by at least 80 or 90 degrees as shown in FIG. 7 is that this helps minimize the lateral dimensions X and Y of the display.

Figure 8:
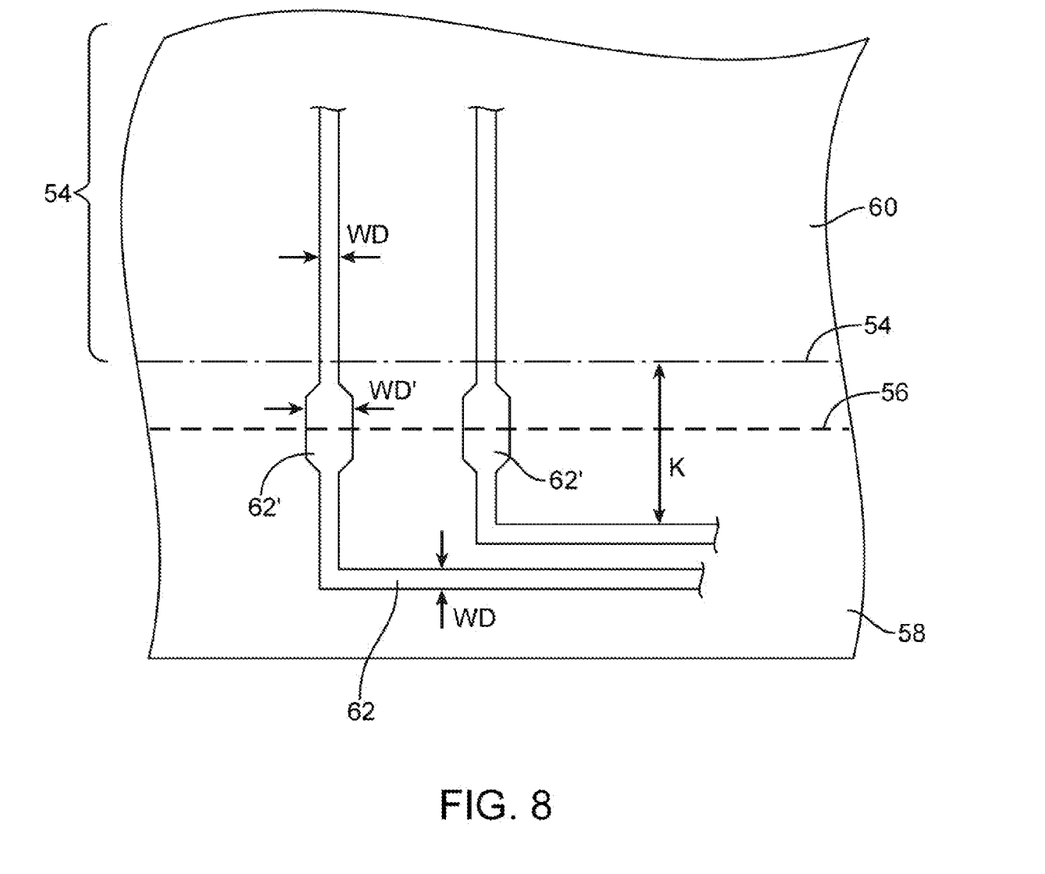
FIG. 8 is a top view of a portion of a display showing how control lines may be provided with enlarged regions in the vicinity of a bend line on the display in accordance with an embodiment of the present invention.

If desired, traces 62 may be enlarged (e.g., widened and/or thickened) in the vicinity of bend axis 56. For example, a trace may be enlarged in a dimension perpendicular to the longitudinal axis of the trace as the trace overlaps bend axis 56. This type of arrangement is shown in FIG. 8. In the example of FIG. 8, each trace (control line) 62 has a nominal width WD that is used in forming lines in the control line fan out region on edge 58 and has an enlarged width WD' in the portion of the line that crosses bend axis (fold line) 56. Traces 62 may be configured so that there is a width K of about 0.2 mm to 3 m between traces 62 and the perimeter of active area 54 to ensure sufficient room for bending edges 58 of substrate 60.

Figure 9:
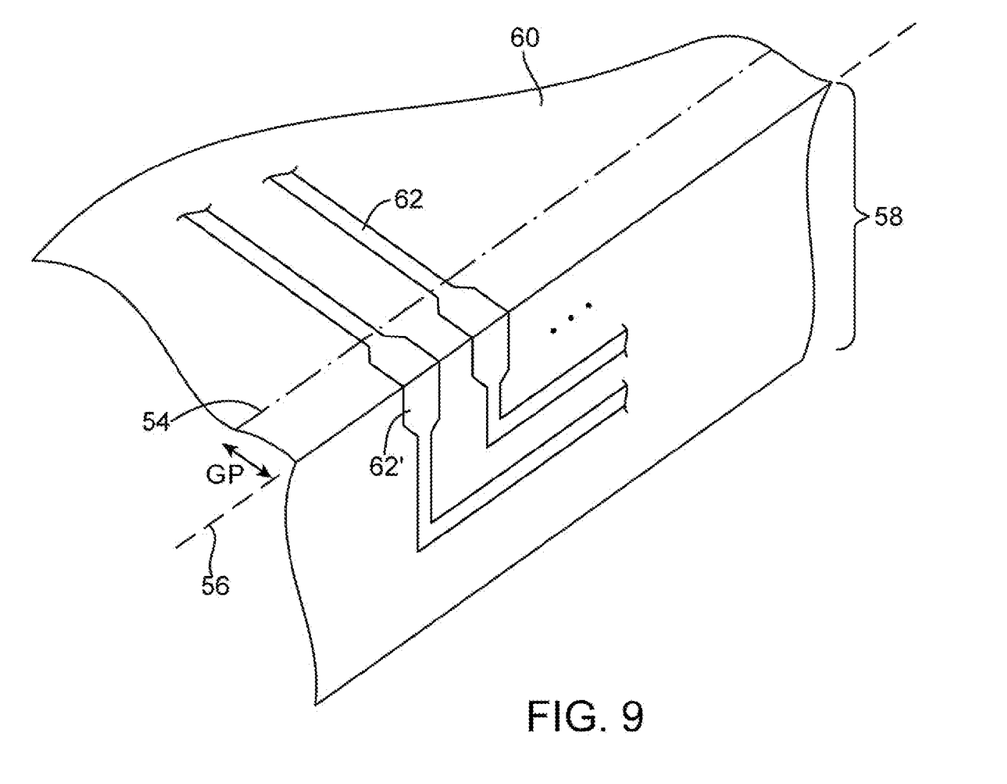
FIG. 9 is a perspective view of the portion of the display shown in FIG. 8 following bending of the edge of the display in accordance with an embodiment of the present invention.

When edge 58 is bent away from the plane of active area 54, substrate 60 of FIG. 8 may have the shape shown in FIG. 9. The enlarged dimensions of traces 62 in the segment of traces 62 that overlaps bend axis 56 may help ensure that traces 62 are not cracked or otherwise damaged when inactive edge 58 of substrate 60 is bent downward away from active region 54.

If desired, openings 68 at the corners of substrate 60 may be formed from holes at the corners of substrate 60. The holes are completely surrounded by portions of substrate 60. In the illustrative example of FIG. 10, substrate 60 has been provided with substantially rectangular holes 68 at each of its four corners. Openings 68 may be formed using holes of other suitable shapes (e.g., ovals, circles, triangles, shapes with combinations of curved and straight sides, or other suitable shapes). The use of rectangular holes in the example of FIG. 10 is merely illustrative.

Figure 10:
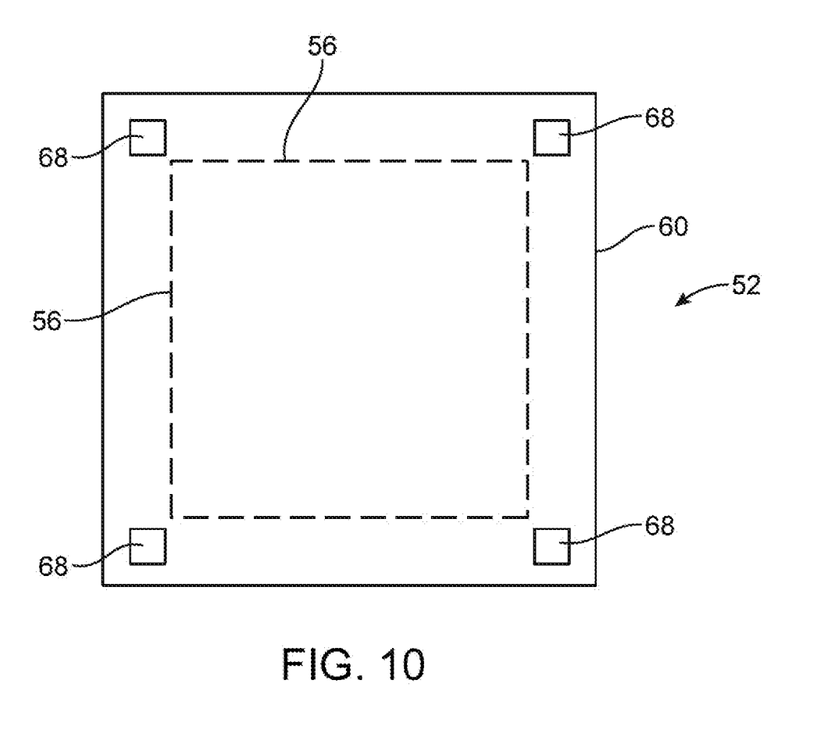
FIG. 10 is a top view of a display showing how holes may be formed at the corners of the display to accommodate bending of the edges of the display in accordance with an embodiment of the present invention.
Figure 11:
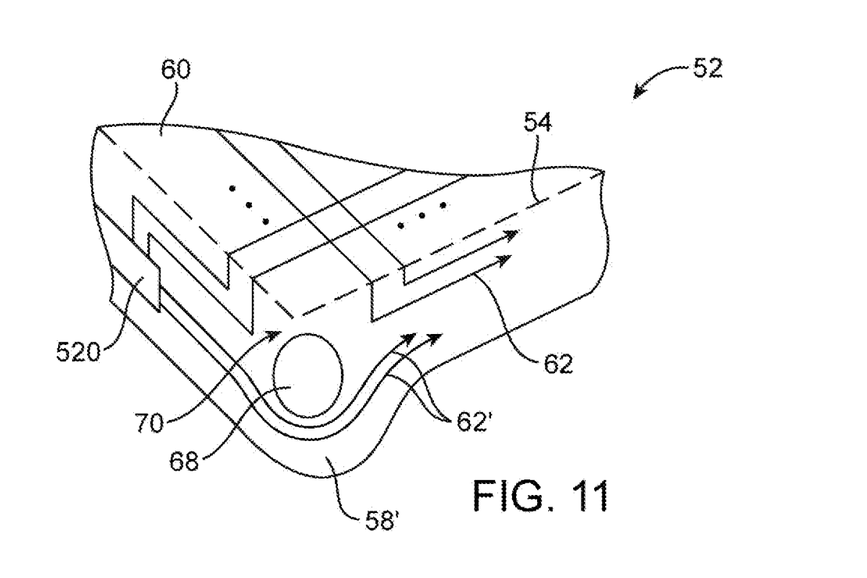
FIG. 11 is a perspective view of a corner of the display of FIG. 10 following bending of the display edges in accordance with an embodiment of the present invention.

A perspective view of a corner portion of organic light-emitting diode layer 52 following folding of a substrate with holes such as holes 68 of FIG. 10 is shown in FIG. 11. As shown in FIG. 11, the use of holes 68 provides additional real estate along the outer edges of the holes for accommodating traces 62. In particular, material 58' may be used to accommodate traces 62' that might otherwise not be able to fit through the area between active area 54 and hole 68 (shown as area 70 in FIG. 11). Traces such as traces 62' may be used to connect an area such as area 66 (FIG. 6) to driver circuitry 520 (e.g., low temperature polysilicon transistors used to implement gate line driver circuits that drive signals onto the gate lines of the pixel array).

In arrangements such as the arrangement of FIGS. 6 and 7, openings 68 may be formed in the shape of notches, so there is no portion of substrate 60 available outboard of opening 68 on which to route lines 62'. As a result, it may be preferable in arrangements of the type shown in FIGS. 6 and 7 to route lines 62' in the area between the periphery of active area 54 and the innermost edge of opening 68 (e.g., by ensuring that opening 68 is not too close to the periphery of active area 54).

Figure 12:
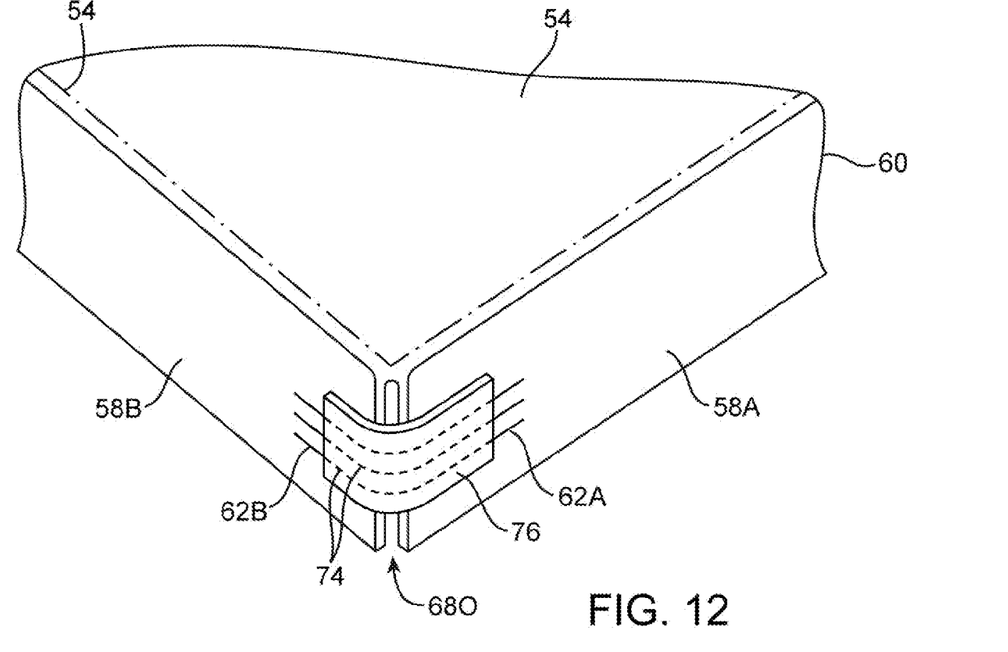
FIG. 12 is a perspective view of a corner portion of a display with folded edges showing how a jumper cable formed from a flex circuit or other cable structure may be used to bridge a gap between respective bent display edges in accordance with an embodiment of the present invention.

Another illustrative technique for routing lines 62 in the corner of the display is shown in FIG. 12. As shown in FIG. 12, a signal path may be formed by bus structure 76. Structure 76 may include signal traces such as signal traces 74 for mating with corresponding portions of control line traces 62A and 62B on edges 58A and 58B of substrate 60. Structure 76 may serve as a jumper that electrically connects traces on edge 58A such as trace 62A to corresponding traces such as trace 62B on edge 58B. A jumper arrangement of this type may be used to bridge any surface irregularities or gaps in substrate 60 at corner 680 of the folded substrate.

Figure 13:
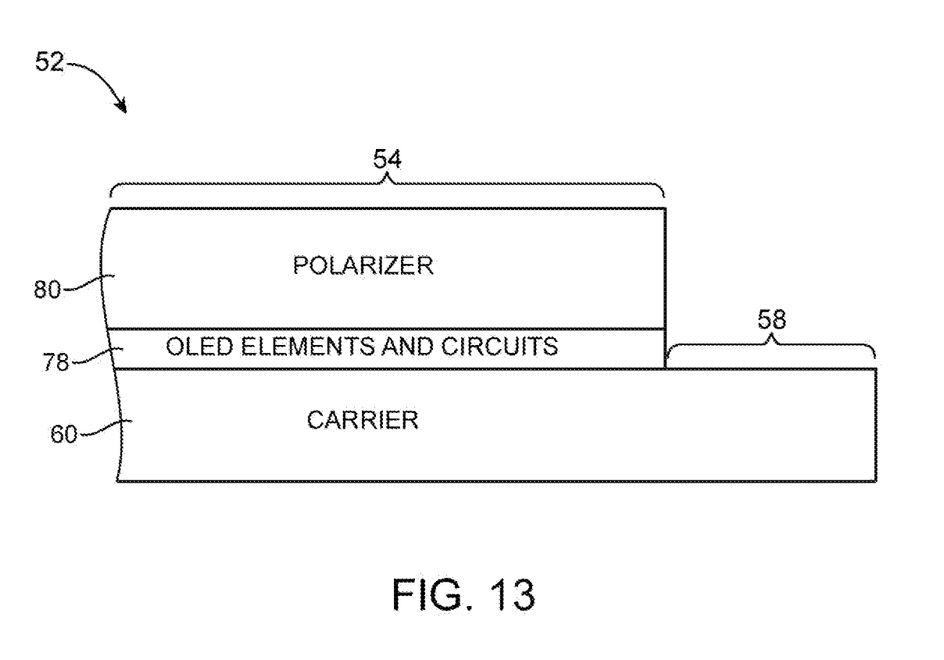
FIG. 13 is a cross-sectional side view of a portion of an illustrative organic light-emitting diode display in accordance with an embodiment of the present invention.

A cross-sectional side view of an illustrative arrangement that may be used in forming organic light emitting diode layer 52 is shown in FIG. 13. As shown in FIG. 13, layer 52 may include a carrier layer such as carrier (substrate 60). Substrate 60 may be formed from one or more flexible polymer sheets or other bendable layers of material. For example, substrate layer 60 may include a layer of polyimide and/or a layer of polyethylene terephthalate, and/or other polymer layers with a total thickness of about 0.08 to 0.16 mm (as an example). Organic light-emitting elements and circuits 78 (which may be about 0.01 mm thick) may include traces such as control line traces 62, driver circuits (in inactive display areas), control circuits 30 (FIG. 4), organic light-emitting diodes 32, and other structures. Circular polarizer 80, which may have a thickness of about 0.13 to 0.21 mm, may be used to suppress reflections from traces 62. Polarizer 80 may be formed over all of layer 52 or may, as shown in FIG. 13, overlap only active area 54. Other types of light-emitting layers may be used in display 14 if desired. The example of FIG. 13 is merely illustrative.

Figure 14:
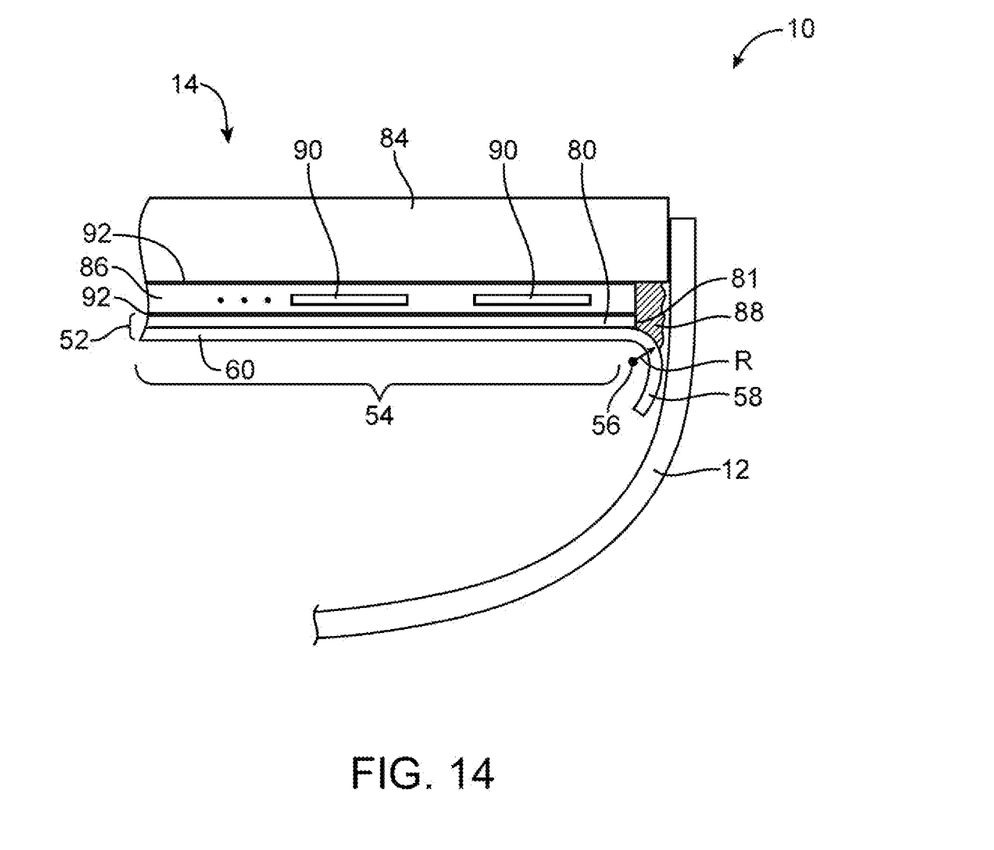
FIG. 14 is a cross-sectional side view of a portion of an electronic device showing how a display with bent edges may be mounted within an electronic device housing in accordance with an embodiment of the present invention.

FIG. 14 is a cross-sectional side view of a portion of device 10 showing how display 14 may be mounted within device housing 12. As shown in FIG. 14, display 14 may have a cover glass layer or other suitable cover layer such as cover layer 84. If desired, display 14 may be provided with a touch sensor such as touch sensor 86. Touch sensor 86 may include capacitive touch sensor electrodes such as electrodes 90 (e.g., indium tin oxide electrodes or other suitable transparent electrodes) or may be formed using other touch technologies (e.g., resistive touch technologies, acoustic touch technologies, touch sensor arrangements using light sensors, force sensors, etc.). In the FIG. 14 example, touch sensor 86 has been implemented as a separate touch panel. This is merely illustrative. Touch sensor electrodes 90 may, if desired, be formed on the underside (inner side) of cover glass layer 84, may be formed on organic light-emitting diode layer 52, or may be formed on other suitable display structures.

The layers of display 14 may, if desired, be laminated together using adhesive (e.g., optically clear adhesive 92). In active region 54, organic light-emitting diode layer 52 may be flat and may form a rectangular planar structure. Inactive portion 58 of layer 52 (see, e.g., edges 58 of substrate 60 in FIGS. 6, 7, 10, and 11), may be bent out of the plane of active region 54 about bend axis 56. After bending, edge 58 may have a flat shape, a curved shape, or other suitable shape that ensures that edge 58 does not protrude excessively past the edge of active area 54 in lateral dimensions X and Y (see, e.g., FIG. 7). To ensure that layer 52 is not damaged during the bending process, bending operations may be performed that limit bending to an acceptable bend radius R. The value of R may be, for example, about 3 to 5 times the thickness of the bent material (e.g., bend radius R may be about 0.2 to 0.5 mm).

Adhesive 88 may serve as a strain relief feature for layer 52 and may be formed in a bead that runs around the perimeter of display 14 adjacent to bend axis 56. In configurations in which polarizer layer 80 does not extend significantly into the inactive region of the display, adhesive 88 may cover edge 81 of polarizer layer 80, as shown in FIG. 14. Examples of materials that may be used in forming strain relief adhesive 88 include clear ultraviolet light cured adhesive and silicone (as examples).

Figure 15:
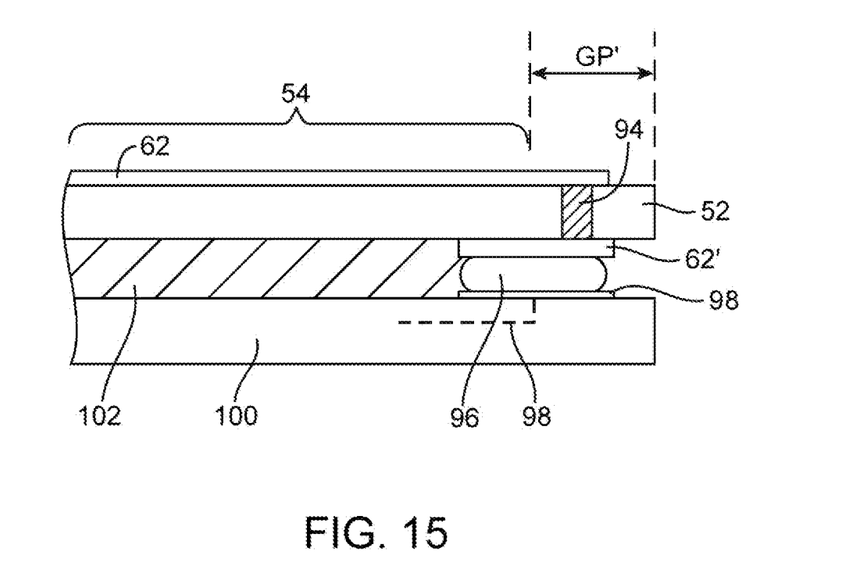
FIG. 15 is a cross-sectional side view of a portion of a display having vias to allow backside contacts to be formed in accordance with an embodiment of the present invention.

If desired, vias may be provided in organic light-emitting diode layer 52. This type of configuration is shown in FIG. 15. As shown in FIG. 15, layer 52 may include vias such as via 94. Vias 94 may interconnect control line traces 62 on the front side of layer 52 to additional traces such as trace 62' on the rear side of layer 52. Traces 62' may be used to distribute control signals from a driver circuit on layer 52 and/or control signals from a flex circuit or other communications path structure that is connected to driver circuitry. Conductive material 96 (e.g., solder, conductive adhesive, etc.) may be used to connect traces 62' to traces 98 on printed circuit board 100. Adhesive 102 may be using in mounting layer 52 to board 100 or other suitable support structure. By using this type of layout, the distance GP' between the edge of active area 54 and the edge of the inactive portion of the display may be minimized without bending layer 52.

The foregoing is merely illustrative of the principles of this invention and various modifications can be made by those skilled in the art without departing from the scope and spirit of the invention.

What is claimed is:

1. A display, comprising:
 a layer with an active area that contains an array of light-emitting elements and an inactive area that includes bent edge portions of the layer, wherein the layer comprises at least one corner region having an opening, wherein the corner region is formed from the bent edge portions of the layer, and wherein the opening is completely surrounded by portions of the layer.

2. The display defined in claim 1 wherein the layer comprises at least one sheet of polymer.

3. The display defined in claim 2 wherein the layer has a substantially rectangular shape.

4. The display defined in claim 2 wherein the opening is interposed between the active area and part of the inactive area, the display further comprising traces on the part of the inactive area.

5. The display defined in claim 1 wherein the layer comprises a polymer layer and wherein the light-emitting elements comprise organic light-emitting diodes.

6. The display defined in claim 1 wherein the bent edge portions include four bent edges of the layer.

7. An electronic device, comprising:
 a housing; and
 a display mounted in the housing, wherein the display includes a flexible substrate layer having a rectangular active region with an array of light-emitting elements that lies in a plane, wherein the flexible substrate includes inactive edge regions that are bent out of the plane, wherein the inactive edge regions are bent out of the plane about a bend axis, and wherein the flexible substrate further comprises a bead of adhesive formed along the flexible substrate region adjacent to the bend axis.

8. The electronic device defined in claim 7 wherein the flexible substrate layer comprises at least two openings at two respective corners of the flexible substrate layer.

9. The electronic device defined in claim 8 wherein the openings comprise notches at the corners of the flexible substrate layer.

10. The electronic device defined in claim 8 wherein the openings comprise holes at the corners of the flexible substrate layer.

11. The electronic device defined in claim 8 wherein the housing comprises metal, wherein the electronic device further comprises a cover glass layer mounted in the housing over the display, and wherein the display includes capacitive touch sensor electrodes.

12. A display, comprising:
 a flexible layer having an active region with four corners, wherein the active region lies in a plane, wherein the flexible layer has openings at two or more of the corners, and wherein the flexible layer has at least two inactive edges that are bent out of the plane; and
 conductive traces on the flexible layer, wherein the flexible layer has an outermost edge and wherein at least some of the conductive traces are interposed between one of the openings and the outermost edge of the flexible layer.

13. The display defined in claim 12 wherein the flexible layer comprises a sheet of polymer, wherein the inactive edges are each bent out of the plane along a respective bend axis that runs parallel to an edge of the active region.

14. The display defined in claim 12 wherein the active region includes an array of organic light-emitting diodes and control lines.

15. The display defined in claim 14 wherein at least some of the control lines are formed on at least one of the inactive edges.

16. The display defined in claim 15 wherein the openings comprise holes that are each completely surrounded by portions of the inactive edges.

17. The display defined in claim 15 wherein the inactive edges are bent out of the plane along bend axes and wherein the control lines have enlarged widths where the control lines overlap the bend axes.

* * * * *